US006911746B2

(12) United States Patent
Orr et al.

(10) Patent No.: US 6,911,746 B2
(45) Date of Patent: Jun. 28, 2005

(54) SIGNAL AND POWER TRANSFORMER COUPLING ARRANGEMENTS

(75) Inventors: Raymond Kenneth Orr, Kanata (CA); Yan-Fei Liu, Kanata (CA); David Alan Brown, Carp (CA); Rajko Duvnjak, Kanata (CA)

(73) Assignee: Potentia Semiconductor, Inc., Wilmington, DE (US)

( * ) Notice: Subject to any disclaimer, the term of this patent is extended or adjusted under 35 U.S.C. 154(b) by 83 days.

(21) Appl. No.: 10/428,103

(22) Filed: May 2, 2003

(65) Prior Publication Data

US 2004/0217837 A1 Nov. 4, 2004

(51) Int. Cl.$^{7}$ .................................................. H03K 3/00
(52) U.S. Cl. ....................................................... 307/107
(58) Field of Search ................. 375/36, 258; 178/63 R; 307/107

(56) References Cited

U.S. PATENT DOCUMENTS 4,341,927 A * 7/1982 Shinoi et al. ............... 375/257
4,758,836 A 7/1988 Scuilli ................... 340/370.31
5,293,400 A 3/1994 Monod et al. ................. 375/7
5,589,891 A 12/1996 McCracken et al. ........ 348/730
5,798,913 A * 8/1998 Tiesinga et al. ......... 363/21.13
5,949,659 A 9/1999 Lesche ........................ 363/16
6,008,681 A 12/1999 Beutler et al. .............. 327/304
6,121,692 A 9/2000 Michaels et al. .......... 307/10.1

FOREIGN PATENT DOCUMENTS

JP 04212528 4/1992 ............ H04B/3/56

* cited by examiner

*Primary Examiner*—Shawn Riley

(57) ABSTRACT

An isolating coupling arrangement couples signals in both directions via a transformer between first and second (or more) units each having differential signal transmit buffers and receivers. A diode bridge and capacitor produce an isolated power supply voltage for the second unit from signals coupled from the first unit via the transformer. The diode bridge can use intrinsic diodes of CMOS output circuits of the transmit buffers, which can be controlled synchronously using a phase locked loop responsive to signals coupled from the first unit via the transformer. A supply voltage for the first unit can be increased to compensate for voltage drops of the diode bridge on start-up prior to the synchronous operation. A resistor in parallel with a diode of the bridge provides an asymmetrical load to create a DC component of transformer magnetizing current to eliminate oscillations during signal gaps.

38 Claims, 6 Drawing Sheets

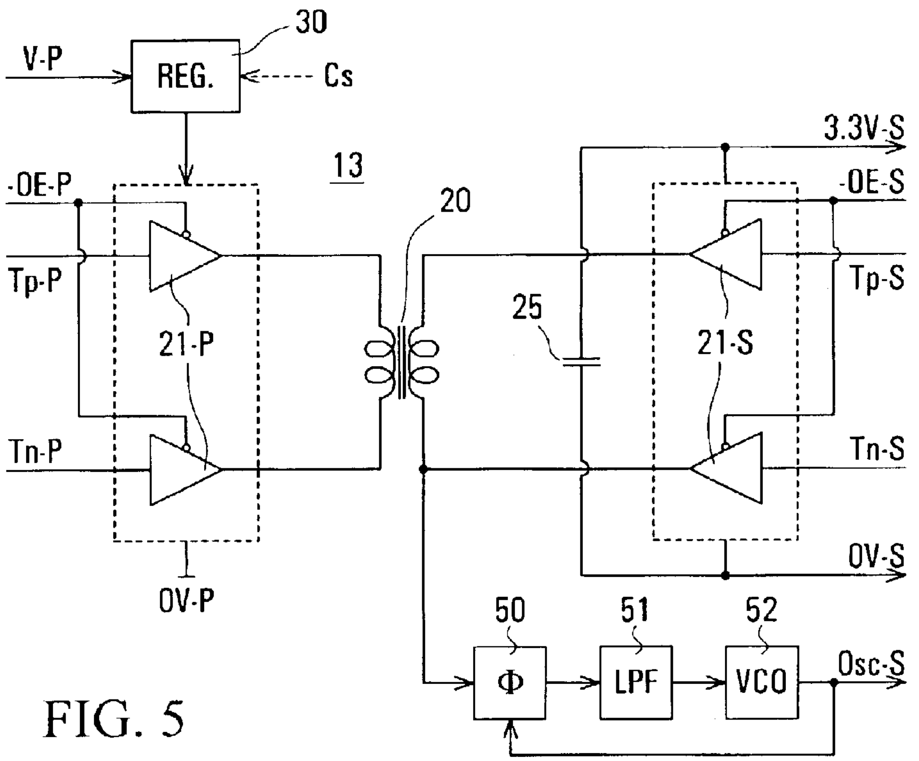
FIG. 5
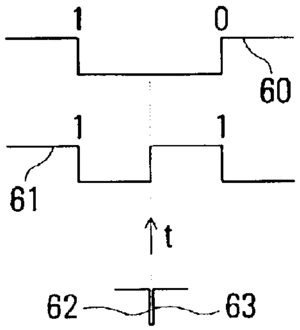
FIG. 6
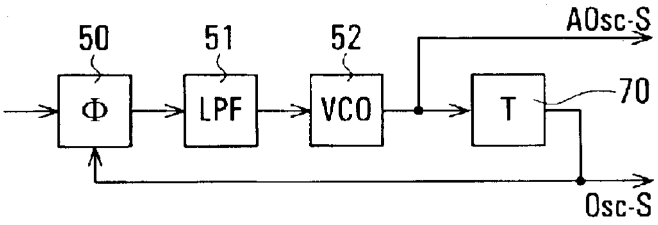
FIG. 7
FIG. 8
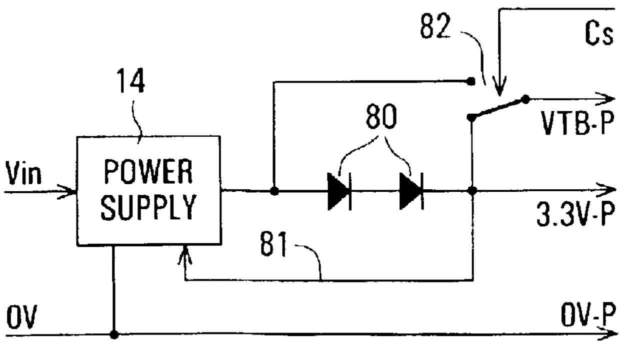

SIGNAL AND POWER TRANSFORMER COUPLING ARRANGEMENTS

This invention relates to arrangements for coupling signals and power via a transformer. Such arrangements can be particularly useful in power supply controllers.

REFERENCE TO RELATED APPLICATIONS

Reference is directed to the following copending United States Patent Applications filed simultaneously herewith, the entire disclosure of each of which is hereby incorporated herein by reference:

"Power Supply Controller", R. Orr et al., (PP010, 79115–8);

"Coupling Signals Via A Coupling Arrangement", D. Brown et al., (PP014, 79115–16);

"Transformer Coupling Arrangement and Method Using A Plurality of Drivers", D. Brown, (PP016, 79115–17).

BACKGROUND

The related applications describe and claim a power supply controller, and various features thereof, which can be used for controlling a plurality of isolating power supplies, such as switch mode power supplies or DC power converters, for providing controlled electrical power to loads. For example, the power supplies may provide different supply voltages to various electrical circuits on a circuit card on which the power supply controller is also provided.

In such a power supply controller, separate IC (integrated circuit) control units can be provided on the primary and secondary sides of a transformer that serves to maintain an electrical isolation barrier between input and output sides of the isolating power supplies. The transformer conveniently provides for signal coupling, desirably in both directions, between the control units, and conveniently also provides for power transfer from its primary to its secondary side to supply operating power to the control unit and to any related circuits (for example, a non-volatile memory) of the power supply controller on the secondary side of the transformer.

It is desirable for such a power supply controller to be implemented in a small package, for example a surface mount package of the order of 27 mm square and 3.5 mm high; this requires that the transformer itself be very small. Although the total power required by the circuits on the secondary side of the transformer may be relatively small, it is still desirable to maximize the efficiency of the power transfer arrangement and to minimize losses of power transferred via the transformer. In addition, it is necessary to provide a desired coupling of signals in both directions via the transformer, while meeting requirements for appropriate signal levels and timing on both the primary and secondary sides of the transformer. Furthermore, the control units may operate asynchronously to one another, in which case the coupling arrangement is required to accommodate asynchronous signalling between the control units.

Accordingly, there is a need to provide signal and power transformer coupling arrangements which can facilitate meeting these considerable requirements.

SUMMARY OF THE INVENTION

According to one aspect of this invention there is provided a transformer coupling arrangement comprising a transformer having first and second windings; at least one transmit buffer in a first unit, the buffer having an output coupled to the first winding of the transformer, and at least one signal receiver in a second unit, the receiver having an input coupled to the second winding of the transformer, for coupling a signal via the transformer in a first direction from the first unit to the second unit; at least one transmit buffer in the second unit, the buffer having an output coupled to the second winding of the transformer, and at least one signal receiver in the first unit, the receiver having an input coupled to the first winding of the transformer, for coupling a signal via the transformer in a second direction from the second unit to the first unit; and a rectifier arrangement coupled to the second winding of the transformer for producing a supply voltage for the second unit from signals coupled in the first direction.

Preferably the transformer coupling arrangement is a differential signal arrangement in which, in each of the first and second units, the at least one transmit buffer comprises at least two transmit buffers having outputs coupled to the respective winding of the transformer for supplying a differential signal thereto, and the at least one signal receiver comprises a differential signal receiver. Preferably the rectifier arrangement comprises a diode bridge having an ac input coupled to the second winding of the transformer and a dc output for producing said supply voltage for the second unit, and a capacitor coupled to the dc output for filtering said supply voltage. A voltage regulator can be coupled to the dc output of the diode bridge for regulating said supply voltage.

Another aspect of the invention provides a transformer coupling arrangement comprising: a transformer having first and second windings; a first unit comprising two transmit buffers having outputs coupled to the first winding of transformer for supplying a signal differentially thereto, and a receiver having an input coupled to the first winding of the transformer for receiving a signal therefrom; a second unit comprising two transmit buffers having outputs coupled to the second winding of the transformer for supplying a signal differentially thereto, and a receiver having an input coupled to the second winding of the transformer for receiving a signal therefrom; and a rectifier arrangement comprising a diode bridge having an ac input coupled to the second winding of the transformer and a dc output for producing a supply voltage for the second unit, and a capacitor coupled to the dc output of the diode bridge for filtering the supply voltage.

Preferably the transmit buffers of each of the first and second units comprise complementary switched output circuits, and the complementary switched output circuits of the transmit buffers of the first and second units are arranged for operation synchronously with one another. The complementary switched output circuits of the transmit buffers of the second unit can comprise intrinsic diodes which constitute the diode bridge of the rectifier arrangement. The second unit preferably comprises a phase locked loop responsive to signals coupled from the first unit via the transformer for controlling the complementary switched output circuits of the transmit buffers of the second unit synchronously with the complementary switched output circuits of the transmit buffers of the first unit.

In an embodiment of the invention, the first and second windings of the transformer have a turns ratio of 1:1. In order to compensate for voltage drops of the intrinsic diodes, compared with relatively small voltage drops of the synchronously operated CMOS output circuits, the transformer arrangement can include a control arrangement for increasing a supply voltage for the transmit buffers of the first unit prior to synchronous operation of the CMOS output circuits of the transmit buffers of the second unit.

In a further embodiment of the invention, the transformer coupling arrangement includes an asymmetrical load coupled to the rectifier arrangement for providing a DC component of current in the transformer. At least when the rectifier arrangement comprises a diode bridge, the asymmetrical load can be constituted by a resistor coupled in parallel with a diode of the rectifier arrangement.

In another embodiment of the invention the transformer includes a third winding, the arrangement including a third unit comprising a signal receiver having an input coupled to the third winding of the transformer and a rectifier arrangement coupled to the third winding of the transformer for producing a supply voltage for the third unit from signals coupled via the transformer. The third unit preferably further comprises at least one transmit buffer coupled to the third winding of the transformer for coupling a signal from the third unit via the transformer.

A further aspect of the invention provides a transformer coupling arrangement comprising: a transformer having first and second windings; a first unit comprising two transmit buffers having CMOS output circuits coupled to the first winding of the transformer for supplying a signal differentially thereto, and a receiver having an input coupled to the first winding of the transformer for receiving a signal therefrom; a second unit comprising two transmit buffers having CMOS output circuits coupled to the second winding of the transformer for supplying a signal differentially thereto, and a receiver having an input coupled to the second winding of the transformer for receiving a signal therefrom; a rectifier arrangement including a diode bridge, comprising intrinsic diodes of the CMOS output circuits of the transmit buffers of the second unit, and a capacitor coupled to a dc output of the diode bridge for producing a supply voltage for the second unit from signals coupled from the first unit via the transformer; and a control arrangement for controlling the CMOS output circuits of the transmit buffers of the second unit synchronously with the CMOS output circuits of the transmit buffers of the first unit. The control arrangement preferably comprises a phase locked loop responsive to signals coupled from the first unit via the transformer.

The invention also provides a transformer coupling arrangement comprising: a transformer having at least three windings; and at least three units each having a signal coupling arrangement for coupling signals to and/or from a respective winding of the transformer whereby signals are coupled via the transformer among the units; wherein at least one of the units comprises a rectifier arrangement coupled to the respective winding of the transformer for producing a supply voltage for the respective unit from signals coupled via the transformer from another of the units.

Preferably the signal coupling arrangement of each of the units comprises a transmit buffer for coupling signals to the transformer and a signal receiver for receiving a signal coupled via the transformer, and each of the units preferably includes a synchronous rectifier arrangement coupled to the respective winding of the transformer.

BRIEF DESCRIPTION OF THE DRAWINGS

The invention will be further understood from the following description by way of example with reference to the accompanying drawings, in which:

FIG. 5 schematically illustrates a further form of parts of the isolating signal and power coupler in accordance with a further embodiment of the invention, using a PLL (phase locked loop);

FIG. 6 is a signal diagram with reference to which operation of the coupler of FIG. 5 is explained;

FIG. 7 schematically illustrates a modification of the PLL arrangement of the coupler of FIG. 5;

FIG. 8 illustrates a modified form of power supply for the power supply controller;

DETAILED DESCRIPTION

Figure 1:
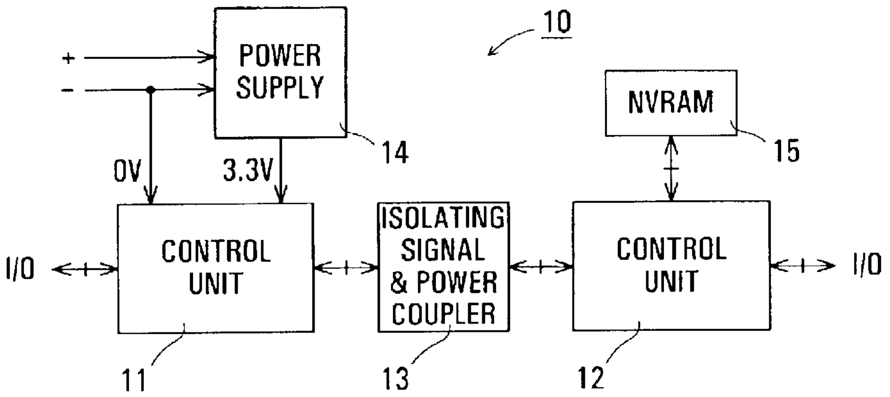
FIG. 1 shows a block diagram of a power supply controller including an isolating signal and power coupler in accordance with the invention.

Referring to FIG. 1, a power supply controller 10 is illustrated for controlling a plurality of isolating power supplies (not shown) to which the power supply controller is connected via I/O (input/output) ports of two control units 11 and 12. By way of example, the power supply controller 10 and the isolating power supplies that it controls may all be provided on a circuit card (not shown), which also includes electrical circuits (not shown) constituting loads to be powered by the power supplies. In use, the circuit card is inserted in an equipment slot and thereby connected to a backplane (not shown) which provides connections to a power source, for example a nominally 48 volt source via connections + and − in FIG. 1.

Via the I/O ports of the control units 11 and 12, the power supply controller 10 can for example monitor the source voltage, monitor and adjust the output voltages of the controlled power supplies, and control sequencing of the power supplies via enable inputs of the power supplies. These functions generally require connections of the power supply controller 10 to both the primary and secondary sides of the isolating power supplies which it controls. In order to maintian electrical isolation between the primary and secondary sides, connections to the primary side are made from the control unit 11, connections to the secondary side are made from the control unit 12, and the two control units communicate with one another via a bidirectional isolating signal and power coupler 13 between them, the coupler 13 also forming a part of the power supply controller 10.

For simplicity and convenience, and for consistency with the terminology used for the isolating power supplies, the control units 11 and 12 are also referred to as first and second units respectively, or as primary and secondary control units respectively; the respective sides of the coupler 13 are also referred to as primary and secondary sides. In addition, drawing references below use suffixes -P and -S to denote similar components on respectively the primary and secondary sides of the power supply controller 10.

As illustrated in FIG. 1, the power supply controller also comprises a power supply 14 and a non-volatile random access memory (NVRAM) 15. The source voltage is supplied to the power supply 14, which provides a supply voltage to the control unit 11. The power supply 14 can for example be a current mode flyback power supply to provide sufficient power for the power supply controller 10, with a start-up circuit provided by a depletion mode MOSFET, and for example provides a supply voltage of 3.3 volts to the control unit 11.

The coupler 13 not only provides for bidirectional signal coupling between the control units 11 and 12, but also couples power in an isolated manner from the control unit 11 to the control unit 12, this coupled power serving to supply operating power to the secondary side of the power supply controller 10, including the control unit 12 and the NVRAM 15. The NVRAM 15 serves to store information used in operation of the power supply controller 10, this information being transferred to the control units 11 and 12 on power-up of the power supply controller 10.

All of the components 11 to 15 of the power supply controller 10 are desirably integrated into a single package, in which each of the control units 11 and 12 conveniently comprises an application-specific IC (ASIC).

Figure 2:
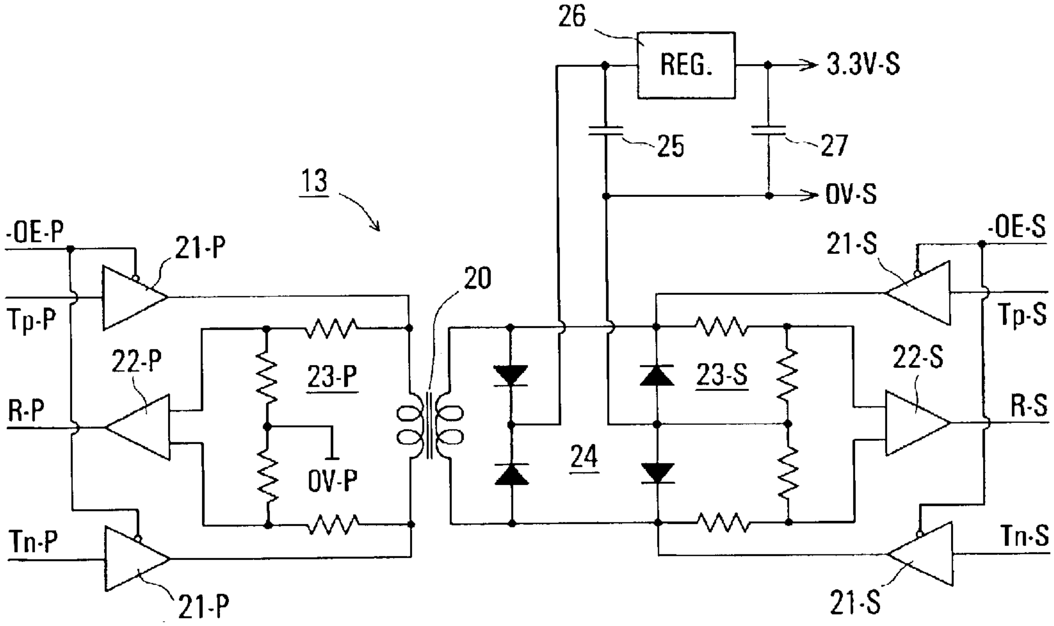
FIG. 2 schematically illustrates one form of the isolating signal and power coupler in accordance with an embodiment of the invention.

Referring to FIG. 2, one form of the isolating signal and power coupler 13 comprises a transformer 20 with primary and secondary windings which are coupled to transmit-receive units of the control units 11 and 12 respectively.

On the primary side, the transmit-receive unit of the control unit 11 comprises differential signal transmit buffers 21-P, a differential signal receiver 22-P, and a balanced resistive potential divider 23-P. To provide a sufficient current drive to the transformer to power the secondary side of the power supply controller as described further below, each of the transmit buffers 21-P may comprise a plurality of buffers or drivers connected in parallel with one another. The transmit buffers 21-P couple differential signals Tp-P and Tn-P supplied to their inputs via their outputs, when an active-low output enable (OE) signal —OE-P is low, to the primary winding of the transformer 20.

When the OE signal -OE-P is high, the outputs of the transmit buffers 21-P have a high impedance, and a signal received from the secondary side of the transformer 20 can be coupled via the resistive potential divider 23-P to the inputs of the differential signal receiver-22-P, which produces at its output a receive signal R-P for the control unit 11.

Similarly, on the secondary side, the transmit-receive unit of the control unit 12 comprises differential signal transmit buffers 21-S, a differential signal receiver 22-S, and a balanced resistive potential divider 23-S. The transmit buffers 21-S (which in this embodiment need not comprise a plurality of drivers in parallel because they are not required for power transfer) couple differential signals Tp-S and Tn-S supplied to their inputs via their outputs, when an active-low output enable (OE) signal —OE-S is low, to the secondary winding of the transformer 20. When the OE signal -OE-S is high, the outputs of the transmit buffers 21-S have a high impedance, and a signal received from the primary side of the transformer 20 can be coupled via the resistive potential divider 23-S to the inputs of the differential signal receiver 22-S, which produces at its output a receive signal R-S for the control unit 12.

The secondary side of the coupler 13 also includes a diode bridge 24 having an ac input connected to the secondary winding of the transformer 20, a filter capacitor 25 connected to a dc output of the diode bridge, a low drop out (LDO) voltage regulator 26, and a further capacitor 27, for producing a supply voltage for the control unit 12 and NVRAM 15.

By way of example, with the primary side supply voltage of 3.3 volts as described above, the transformer 20 can have a primary to secondary turns ratio of 3:5, and the regulator 26 can provide a secondary side supply voltage 3.3 V-S also of 3.3 volts. Zero voltages 0 V-P and 0 V-S on the primary and secondary sides of the transformer 20 are also illustrated in FIG. 2, these being isolated from one another to maintain the electrical isolation between the primary and secondary.

The resistive potential dividers 23-P and 23-S can be designed to provide large differential signals (greater than 1.5 volts) at the inputs of the receivers 22, while limiting input voltage swings to a range of 0 to 3.3 volts. For example, all of the resistors of the potential divider 23-P can have the same resistance R, for example 5.7 Ω; the two resistors of the potential divider 23-S connected to the transformer secondary winding can each have a resistance 4.5R, and the other two resistors of the potential divider 23-S can each have a resistance R.

Conveniently, Manchester code is used for the signals, to avoid transformer saturation. In an alternating manner with a timing determined by the control unit 11, a differential signal (which may comprise a control signal to be communicated, or idle data) Tp-P, Tn-P is supplied from the control unit 11 to produce the signal R-S for the control unit 12, this signal also providing for power transfer from the transmit buffers 21-P via the transformer 20 and the components 24 to 27 to produce the supply voltage for the control unit 12 and NVRAM 15, and a differential signal Tp-S, Tn-S is supplied in the opposite direction from the control unit 12 to produce the signal R-P for the control unit 11. On power-up, when the capacitors 25 and 27 are initially discharged, the OE signal —OE-P can be used to increase a duty cycle of the signal Tp-P, Tn-P progressively from a small value, to reduce peak current flow for charging these capacitors.

Although the form of the coupler 13 illustrated in FIG. 2 is effective, it can be modified as described below to incorporate a number of significant improvements. As these improvements do not relate primarily to the differential signal receivers 22-P and 22-S or their resistive potential dividers 23-P and 23-S, for clarity and simplicity these are not illustrated in the subsequent figures of the drawings and are not generally discussed further below, but it should be understood that at least the differential signal receivers 22-P and 22-S, or their equivalents, are still present in the described embodiments of the invention. However, these receivers may conceivably be simplified, and/or the resistive potential dividers 23-P and 23-S may conceivably be simplified or omitted, as a result of some of the improvements and changes described below.

In the power supply controller of FIG. 1, the control units 11 and 12 can operate asynchronously each in accordance with the timing of its own oscillator. To allow a tolerance of for example ±5% for each oscillator, and hence a tolerance of ±10% between the two units 11 and 12 and hence for the timing of signals transferred in the two directions via the coupler 13, and to provide a guard period between signal transmissions in opposite directions via the coupler 13, it is desirable to provide a framing structure for signal coupling via the transformer. In this frame structure for example a plurality of bits are coupled from the primary to the secondary, then after a guard time a plurality of bits are coupled from the secondary to the primary, and, after another guard time and a delay to accommodate the asynchronous timing, this process is repeated. For example in this case each frame may couple 24 bits in each direction, and may have a duration corresponding to that of 64 bits, with each guard time having a 2-bit duration.

As in this case power may only be transferred from the primary to the secondary of the transformer 20, to charge the capacitor 25, for 24 out of 64 bit durations, and at other times this capacitor is steadily discharged to power the secondary side circuits, the frame duration is limited in order to limit voltage sag of the capacitor 25, and the coupling of signals is relatively inefficient (only 48 bits being coupled in 64 bit durations). Accordingly, to provide a desired signalling rate via the coupler 13 requires relatively higher clock frequencies of the control units 11 and 12.

In addition, a voltage drop of the capacitor 25 that occurs between successive times when a signal (and hence power) is coupled from the primary to the secondary results in a current peak occurring in each frame when the coupling of signals from the primary to the secondary is resumed. The current capacity of the transmit buffers 21-P, and hence their size and/or number, must be increased to handle such current peaks.

Furthermore, the power that is transferred from the primary to the secondary via the transformer 20 includes power losses which take place in the transformer 20 itself, in the diode bridge 24 due to diode forward voltage drops, and in the regulator 26. Although the power supplied to the secondary circuits may be small, these power losses constitute a large proportion of the total power transferred via the transformer 20. For example, with the transformer turns ratio of 3:5 and supply voltages of 3.3 V as indicated above, these power losses comprise about 40% of the total power transferred via the transformer 20. These power losses also considerably increase the current capacity required of the transmit buffers 21-P.

In an embodiment of the invention, the loss of power transferred via the transformer 20 is reduced by removing the regulator 26 from the secondary side of the transformer 20. In this case preferably a regulator is instead provided on the primary side of the transformer 20 as described below with reference to FIG. 3, or no regulator can be provided.

Figure 3:
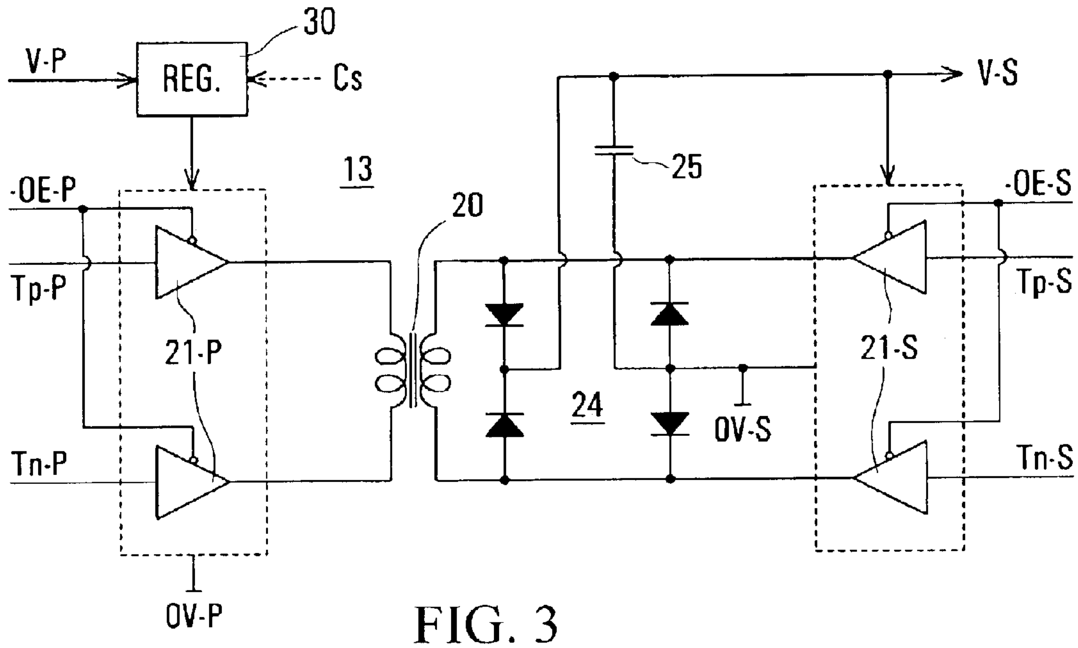
FIG. 3 schematically illustrates another form of parts of the isolating signal and power coupler in accordance with another embodiment of the invention.

Referring to FIG. 3, in which as indicated above the receiver circuits are not shown, the isolating signal and power coupler 13 illustrated therein is similar to that of FIG. 2 except in that the LDO regulator 26 and capacitor 27 of FIG. 2 are omitted, a secondary voltage V-S for the secondary side circuits, including the transmit buffers 21-S as illustrated, being derived directly from the capacitor 25. In addition, on the primary side of the coupler of FIG. 3 a voltage regulator 30 regulates a primary side supply voltage V-P to produce a supply voltage for the transmit buffers 21-P. The regulator 30 can be controlled as described below by a control signal Cs, shown by a broken line to illustrate that this is optional.

In the coupler 13 of FIG. 3, the absence of a voltage regulator on the secondary side of the transformer 20 means that power losses in such a regulator are avoided, so that less power needs to be transferred from the primary to the secondary of the transformer. The current capacity required of the transmit buffers 21-P is reduced for this reason, and also because the voltage sag of the capacitor 25 may be reduced, the latter offsetting to some extent the absence of secondary side voltage regulation.

However, in the coupler 13 of FIG. 3 voltage regulation can be provided indirectly by the regulator 30 on the primary side. More particularly, the secondary control unit 12 can monitor the secondary voltage V-S and provide a corresponding signal, as part of the signalling from the secondary to the primary via the transformer 20, to the primary control unit 11, which produces the signal Cs to control the regulator 30. Accordingly, a voltage supplied from the regulator 30 to the primary side transmit buffers 21-P is controlled by closed loop feedback to maintain an average of the secondary voltage V-S at a desired level.

It can be appreciated that alternatively the control unit 11 can supply the control signal Cs to the regulator 30 in an open loop control arrangement, or this control signal can be omitted. In addition, the regulator 30 can be omitted or can be incorporated into the power supply 14 shown in FIG. 1.

In another embodiment of the invention, described further below, loss of power transferred via the transformer 20 is reduced, and numerous other advantages are provided, by using synchronous rectification on the secondary side of the transformer 20.

Figure 4:
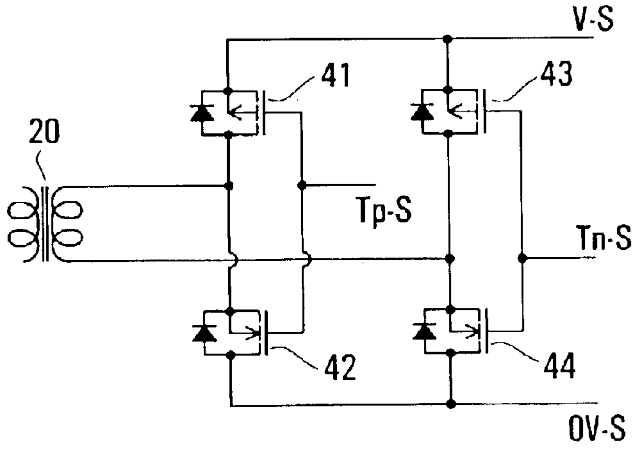
FIG. 4 schematically illustrates a further form of parts of the isolating signal and power coupler in accordance with another embodiment of the invention.

FIG. 4 illustrates the transformer 20, complementary switched output circuits of the transmit buffers 21-S, and connections of the output circuits to the transformer 20, to the supply voltages V-S and OV-S, and to the complementary drive signals Tp-S and Tn-S. For simplicity and clarity, the output enable signals and their connections are not shown in FIG. 4.

As illustrated in FIG. 4, one of the output circuits comprises p- and n-channel MOS (metal oxide semiconductor) transistors 41 and 42 connected to form a CMOS (complementary MOS) output circuit, with gates of the transistors driven by the signal Tp-S and an output connected to one end of the transformer secondary winding. The other output circuit similarly comprises CMOS transistors 43 and 44 with their gates driven by the signal Tn-S and an output connected to the other end of the transformer secondary winding. Diodes in parallel with the drain-source path of each transistor are part of the structure of the transistors and are also shown in FIG. 4.

As the signals Tp-S and Tn-S are complementary, it can be appreciated that a signal supplied to the transmit buffers 21-S alternately drives the diagonals of a bridge formed by the transistors 41 to 44 into conduction; thus the transistors 41 and 44 simultaneously conduct alternately with the transistors 42 and 43 which also simultaneous conduct.

It can further be seen that the intrinsic or parasitic diodes of the transistors 41 to 44 have the same bridge arrangement as the diodes of the diode bridge 24 in FIG. 3. Consequently, it can be seen that the separate diode bridge 24 is redundant and can be omitted from this form of the coupler 13.

In addition, it can be appreciated that conduction of each transistor provides a substantial short of its intrinsic diode, so that synchronous operation of the transistors 41 to 44 on the secondary side of the transformer 20 with corresponding MOS transistors in the output circuits of the transmit buffers 21-P on the primary side of the transformer 20 enables the forward voltage drops of the diodes, and the corresponding secondary side power losses, to be substantially eliminated. However, it should be appreciated that on power-up, when the capacitor 25 is initially being charged from zero volts, the supply voltage V-S is insufficient to enable such synchronous operation so that the diodes necessarily provide rectification and their forward voltage drops are present.

It will be appreciated that the output circuits of the transmit buffers 21-P on the primary side of the transformer 20 have a similar arrangement to that shown in FIG. 4 for the transmit buffers 21-S.

To provide for synchronous operation of the rectifier bridge formed by the MOS transistors 41 to 44, a PLL (phase locked loop) can be provided on the secondary side of the transformer 20, for example as illustrated in FIG. 5. The PLL desirably has fast attack and slow decay times.

Referring to FIG. 5, the primary side of the isolating signal and power coupler 13 illustrated therein is the same as that of the coupler shown in FIG. 3, including the regulator 30. On the secondary side of the transformer 20, the transmit buffers 21-S, controlled by the signals —OE-S, Tp-S, and Tn-S, are provided with their outputs connected to the secondary winding of the transformer 20 in a similar manner to that of FIG. 3. However, in the coupler of FIG. 3 the current capacity of the transmit buffers 21-S of FIG. 5 is matched to that of the transmit buffers 21-P on the primary side of the coupler of FIG. 5, as further described below.

In the coupler of FIG. 5, there is no separate diode bridge as in the coupler of FIG. 3, a rectifying bridge instead being provided by the intrinsic diodes and synchronously driven output transistors of the transmit buffers 21-S as described above with reference to FIG. 4. Consequently, in the coupler of FIG. 5 the secondary circuit supply, shown as being at 3.3 and 0 volts on lines 3.3 V-S and 0 V-S respectively, is produced by the transmit buffers 21-S, and is again smoothed by the capacitor 25 connected between these lines.

In addition, the secondary side of the coupler 13 of FIG. 5 includes a PLL constituted by a phase comparator (ϕ) 50, a low pass filter (LPF) 51, and a voltage controlled oscillator (VCO) 52. One end of the secondary winding of the transformer 20, and an output of the VCO 52, are connected to inputs of the phase comparator 50, whose output is supplied via the LPF 51 to control the frequency of the VCO 52. The VCO 52 thereby produces a secondary side oscillator output signal Osc-S which is synchronized to the primary side oscillator frequency, as communicated to the secondary side by the timing of signals coupled via the transformer 20.

The secondary control unit 12 uses the signal Osc-S to determine the timing of the complementary signals Tp-S and Tn-S, so that as discussed above the output circuits of the transmit buffers 21-S on the secondary side are operated synchronously with the output circuits of the transmit buffers 21-P on the primary side of the transformer 20.

Numerous significant advantages of the coupler of FIG. 5 exist and are indicated below.

First, the same voltage (for example, 3.3 v) supplied to the primary transmit buffers 21-P as is derived from the secondary transmit buffers enables the transformer 20 to be provided with a 1:1 turns ratio, enabling it to have an improved design and performance with reduced losses. Because there is no change in signal voltage in either direction, the resistive potential dividers 23-P and/or 23-S coupled between the transformer windings and the differential signal receivers 22-P and 22-S respectively (not shown in FIG. 5) can potentially be omitted, the inputs of the receivers being connected directly to the transformer windings.

The secondary side PLL provides for synchronous rectification using the MOS transistors of the output circuits of the transmit buffers 21-S, bypassing the intrinsic diodes forming a diode bridge and thereby removing the diode forward voltage drops and associated power losses.

The synchronous operation of the secondary side relative to the primary side of the transformer 20 also enables the guard and delay times of the framing structure described above to be reduced or eliminated, so that all bit times can be used for coupling a signal in either direction via the coupler 13. Consequently, clock speeds can be reduced for the same rate of signal transfer via the coupler.

Further, the synchronous operation enables this framing structure to be simplified or dispensed with entirely. For example, instead individual bits can be coupled in opposite directions alternately via the signal coupler 13 of FIG. 5.

Both of the previous two advantages would also enable a more continuous (and in the former case, greater) transfer of power from the primary to the secondary, resulting in reduced voltage sag of the capacitor 25, better stability and/or regulation of the secondary voltage supply, and reduced peak currents handled by the transmit buffers 21-P. However, this advantage is pre-empted and far exceeded by the following very significant advantage.

In the coupler of FIG. 5 as described here, power is not only transferred from the primary to the secondary when a signal is supplied from the primary to the secondary, but is also transferred from the primary to the secondary when a signal is supplied in the opposite direction, from the secondary to the primary, the outputs of the transmit buffers 21-P also being enabled at this time.

This can be seen from the fact that the MOS transistors in the output circuits of the primary and secondary transmit buffers 21-P and 21-S, when enabled, are simply synchronous switches that allow a power transfer to take place, regardless of the signal direction. Viewed alternatively, it can be appreciated that the power transfer takes place throughout the bit durations of the signals, whereas as discussed further below the Manchester code signals use the timing of the edges of the signals, so that the two processes of signal coupling and power transfer are largely independent and can take place in opposite directions at the same time.

Consequently, the coupler of FIG. 5 can provide a substantially continuous power transfer via the transformer 20. Power can be transferred during every signal bit, so that the average current capacity of the transmit buffers 21-P is reduced by a factor of more than 2 (by 64/24 compared with the example given above). As the peak current can be similar to the average current, this, combined with the reduced power losses in the transformer 20 and bridge rectifier and the absence of a secondary side regulator, means that the current capacity, and hence the size and/or number, of transmit buffers 21-P can be greatly reduced. As indicated above, the transmit buffers 21-S in this case have the same current capacity as the transmit buffers 21-P because they carry substantially the same current.

It can be appreciated that, for the same reasons as explained above, the synchronous rectification in the coupler of FIG. 5 would enable power to be transferred in either direction between the primary and secondary sides of the transformer 20, again regardless of the signal direction. While this feature is not used in the coupler of FIG. 5 because power only needs to be transferred from the primary to the secondary, it could be used to advantage in other applications of the isolating signal and power coupler. Thus the coupler of FIG. 5 itself (as distinct from, for example, the regulator 30) is fully bidirectional for both signal coupling and power transfer simultaneously in the same or opposite directions.

For the synchronous operation described above, for example for a signal coupled from the primary to the secondary, the differential signal receiver 22-S determines the state of each Manchester encoded signal bit in order that the transistors of the appropriate bridge diagonal, i.e. the transistors 41, 44 or the transistors 42, 43, are made conductive. This is explained further with reference to the signal diagram in FIG. 6.

In FIG. 6, a Manchester code waveform 60 represents a sequence of two signal bits having logic levels 1 and 0 respectively, and a Manchester code waveform 61 represents a sequence of two signal bits both having logic level 1. At a time t at the end of the first bit, the Manchester coding provides no signal transition (waveform 60) when the second bit is different from the first bit, or a signal transition (waveform 61) when the two bits are the same. Thus to determine the state of each successive bit, the receiver 22-S only needs to determine whether or not there is a signal transition at each time t. This information is also required for the control unit 12 to determine which bridge diagonal is to be made conductive during the respective halves of the ensuing bit duration, to provide for the transfer of power as described above.

To this end, as shown by a further waveform shown in FIG. 6, the outputs of all of the transistors 41 to 44 are disabled (via the output enable signal —OE-S) with a waveform edge 62 which occurs immediately before the time t and are again enabled with a waveform edge 63 which occurs just after the time t. In the short intervening period, the receiver 22-S determines whether or not there is a signal transition, and the control unit 12 accordingly controls the transistors 41 to 44 so that the appropriate bridge diagonal is made conductive. For every encoded bit there is also a signal transition at the mid-point of the bit duration, when the conductive diagonal of the bridge is switched.

A similar process can be followed for the control of the bridge diagonals of the primary side transmit buffers 21-P in response to signals coupled from the secondary side of the transformer 20.

It can be appreciated from FIG. 6 and the above description that in the coupler of FIG. 5 the output circuits of the transmit buffers on the signal receiving side of the transformer 20 are disabled for only a very small part of the duration of each encoded bit, so that the transfer of power can be substantially continuous, and that this disabling ensures that only the appropriate bridge diagonal is made conductive at each instant. It is observed that during the short period between each pair of edges 62 and 63 as shown in FIG. 6, when the outputs of all of the transmit buffers are disabled so that there is a signal transmission gap or pause, the arrangement described later below with reference to FIGS. 9 to 14 can serve to provide a stable and predetermined state in a manner similar to that described with reference to those figures.

To facilitate the timing of the edge 62 immediately in advance of the time t for each bit, the PLL of the coupler of FIG. 5 can be modified as shown in FIG. 7, to include an additional delay element 70 providing a short time delay T. In the PLL of FIG. 7, the output of the VCO 52 constitutes an advanced oscillator output signal AOsc-S which can be used to determine the timing of the edge 62, and this signal is delayed by the delay element 70 to constitute the main oscillator output signal Osc-S which is supplied to the phase comparator 50. The delay element 70 can, for example, be constituted by a propagation delay of one or more logic elements.

As indicated above, on power-up of the power supply controller including the coupler 13 of FIG. 5, the synchronous rectification on the secondary side as described above is not possible because at this time, as the capacitor 25 is being charged from a discharged state, there is an inadequate supply voltage for the circuits on the secondary side of the transformer 20. Accordingly, during a start-up period the intrinsic diodes of the transistors 41 to 44 operate as a bridge rectifier for charging the capacitor 25.

These diodes have a forward voltage drop which reduces the secondary supply voltage to which the capacitor 25 can initially be charged. While the secondary circuits may be designed to start up at such a lower supply voltage, it may be desirable to avoid this partially or completely by increasing the primary side voltage applied to the transmit buffers 21-P during the start-up period. This can be done by controlling the regulator 30 as described above using the control signal Cs, for example increasing the supply voltage applied to the transmit buffers 21-P for either a fixed start-up period or until a signal indicating synchronous operation is received from the secondary side.

In addition, the regulator 30 can include current limiting to limit the peak current that must be coupled via the transformer 30 for charging the capacitor 25, and/or can be designed to provide an output voltage which increases gradually on start-up so that the voltage of the capacitor 25 is also increased gradually on start-up.

Alternatively, the regulator 30 of FIG. 5 need not be provided, and the supply voltage applied to the transmit buffers 21-P can be temporarily increased for start-up by a modified arrangement such as that shown in FIG. 8.

Referring to FIG. 8, in this modified arrangement the power supply 14 of FIG. 1 produces, from its input voltages Vin and 0 V, the regulated primary side supply voltage 3.3 V-P of 3.3 volts, relative to the primary side zero voltage 0 V-P, via two forward biassed diodes 80. The power supply 14 monitors the voltage 3.3 V-P via a line 81, and regulates this voltage accordingly. A switch 82 normally has the position shown in FIG. 8 to select the voltage 3.3 V-P as a supply voltage VTB-P for the transmit buffers 21-P, but during the start-up period is controlled by the control signal Cs to select instead the output voltage of the power supply 14, which is greater by two diode forward voltage drops to compensate for the voltage drops in the secondary side bridge rectifier.

As described above, at least in some embodiments of the invention a guard time of, for example, two bits duration is provided between coupling of signal bits in the two opposite directions via the coupler. This guard time avoids the possibility of both the primary and the secondary transmit buffers simultaneously trying to drive signals via the transformer 20. However, parasitic elements of the coupling arrangement, such as the magnetizing inductance of the transformer 20 and capacitances of the drivers and other components connected to the transformer, can produce oscillations during the guard times, and such oscillations can be wrongly interpreted as parts of communicated signals.

Even though the receivers may be designed to reduce errors due to such oscillations, for example by rejecting signal transmissions of different durations, signal coupling errors can still arise due to changes of oscillation frequency and/or over time and with variation of magnetizing inductance current when an oscillation is interrupted at the start of a communicated signal.

A further embodiment of the invention, described below with reference to FIGS. 9 to 14, provides in the transformer a controllable and predictable DC magnetizing current which can suppress these oscillations and can provide a predictable state of the electrical signal produced by the transformer during the guard periods or other pauses when no signal is coupled to the transformer.

More particularly, when the primary or secondary transmit buffers have transmitted a sequence of signal bits as described above, the outputs of these transmit buffers are disabled, i.e. placed in a high impedance state, and the corresponding primary or secondary receiver expects to receive a signal. However, the receiver can incorrectly interpret as the expected signal, thereby producing signal communication errors, an AC waveform produced by resonance of the magnetizing inductance of the transformer 20 with the parasitic capacitances of the drivers and/or reverse biassed diodes.

Critical damping of such resonance by a resistor connected in parallel with the primary or secondary winding of the transformer 20 is undesirable because such a resistor must have a relatively low value to achieve critical damping, resulting in excessive power losses in the resistor due to the signal amplitudes that are required for coupling power via the transformer. Increasing the transformer inductance and/or the parasitic capacitance, in order to reduce the resonance frequency to avoid misinterpretation by the receiver involves undesirably increasing the size (number of turns and/or core size) of the transformer and/or power losses (proportional to capacitance, frequency, and square of the applied voltage) due to driving the parasitic capacitance. Accordingly, such measures are not desirable in this case.

Instead, in a further embodiment of the invention an asymmetrical load is used to create a differential voltage drop across the output, or parasitic, resistances of the drivers in different halves of the signal bit periods. The voltage drop produces an asymmetrical voltage applied to the transformer, thereby producing a DC component in the magnetizing current in the transformer, with a direction opposite to that of the current flowing through the asymmetrical load.

Figure 9:
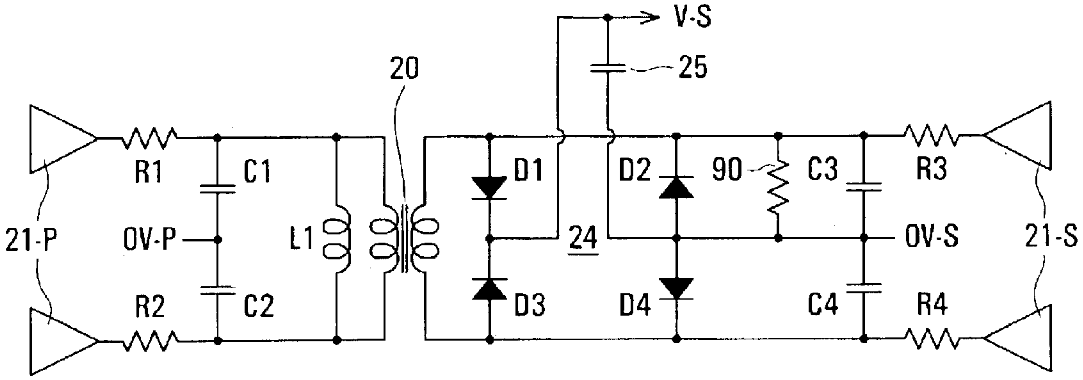
FIG. 9 schematically illustrates a form of parts of an isolating signal and power coupler in accordance with a further embodiment of the invention, the figure also showing parasitic elements.

One form of such an arrangement of the coupler is illustrated in FIG. 9, which shows the transmit buffers 21-P and 21-S, the transformer 20, the diode bridge rectifier 24, and the capacitor 25 providing the secondary voltage V-S in a similar manner to that described above. FIG. 9 identifies the individual diodes of the diode bridge as diodes $D_1$ to $D_4$, and also shows an asymmetrical load provided by a resistor 90 in parallel with the diode $D_2$. FIG. 9 further shows resistors $R_1$ to R4 in series with the outputs of the drivers 21-P and 21-S to represent output resistances of these drivers, respective shunt capacitors C1 to C4, each connected between a respective one of these output nodes and the respective ground or 0 V connection (0 V-P on the primary side and 0 V-S on the secondary side of the transformer 20), representing the combined capacitance of the respective driver, the receiver, and stray capacitance at the node, and an inductor L1 in parallel with the primary winding of the transformer 20 and representing the magnetizing inductance of the transformer. For clarity and simplicity, FIG. 9 does not show the input and output enable connections of the drivers 21-P and 21-S, the receivers 22-P and 22-S and their couplings to the transformer 20, and the supply voltage arrangements (other than the bridge rectifier 24 and the capacitor 25) on the primary and secondary sides of the transformer 20; these can for example be as already described above.

Figure 10:
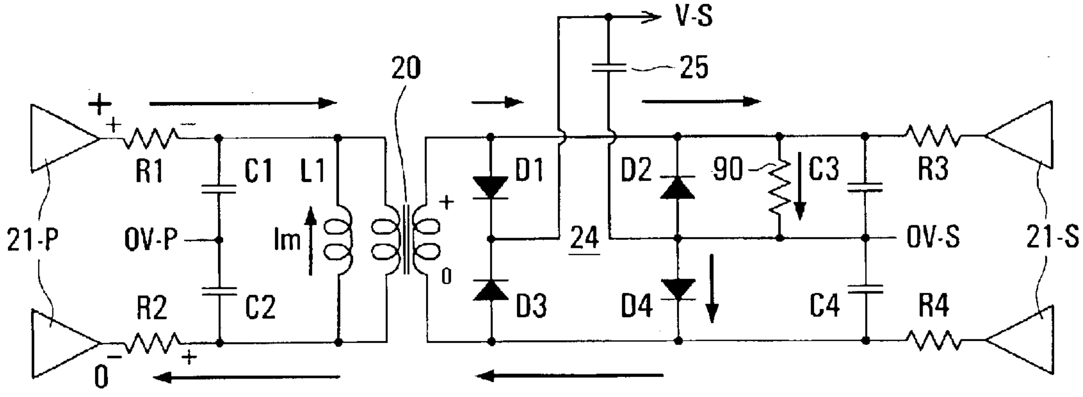
FIGS. 10 to 14 illustrate current flows in various operating states of the coupler of FIG. 9.
Figure 11:
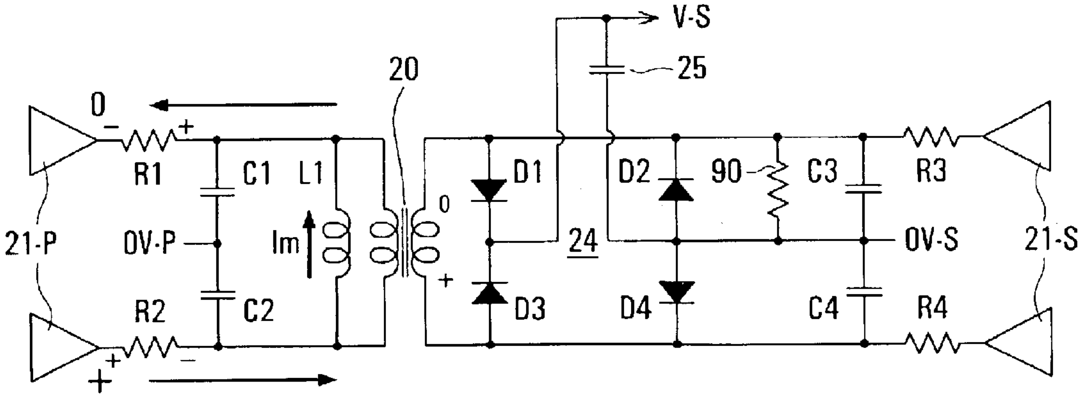

The operation of the coupler of FIG. 9 is described below with reference to FIGS. 10 to 14, each illustrating the coupler, and with arrows representing current flows in various operating states and illustrating voltage polarities. It will be recalled that each signal bit is Manchester encoded so that there is a half bit period of each polarity of the respective drivers. FIGS. 10 and 11 relate to signal coupling from the primary to the secondary with respective half-bit polarities, FIGS. 12 and 13 relate to signal coupling from the secondary to the primary with respective half-bit polarities, and FIG. 14 relates to the guard time or pause period during which no signal is coupled. In each of these figures Im represents the DC component in the magnetizing current in the transformer, as referred to above.

FIG. 10 illustrates current flows for a case where the upper driver 21-P produces a positive (+) output voltage (the primary supply voltage) and the lower driver 21-P produces a zero (0) output voltage (0 V-P). The polarity at the secondary winding of the transformer is such that a current, additional to the normal load current, flows via the asymmetrical load resistor 90 and the diode D4 as illustrated. This additional current causes an additional voltage drop across the resistors R1 and R2 of the drivers 21-P, with the polarities shown, which reduces the amplitude of voltage applied to the primary winding of the transformer 20.

FIG. 11 illustrates current flows for the opposite polarity, with the upper driver 21-P producing a zero (0) output voltage and the lower driver 21-P producing the positive (+) output voltage. The polarity at the secondary winding of the transformer is such that there is no current through the resistor 90, and hence no current to create any additional voltage drop across the resistors R1 and R2. Consequently, in this half-bit period a higher voltage is applied to the primary winding of the transformer 20.

The different voltages applied to the transformer in the respective half-bit periods produce a DC component of current in the transformer, with a polarity which is opposite to that of the current flow through the resistor 90. This DC component will increase until a balance is achieved, i.e. until a voltage drop across the resistors R1 and R2 (with the polarities shown in FIG. 11) caused by the DC component is equal to the voltage drop across these resistors (with the polarities shown in FIG. 10) due to the current flow through the resistor 90. Thus in this balanced state equal voltages are dropped by the resistors R1 and R2 in the two half-bit periods, voltages of equal amplitude are applied to the transformer in the two half-bit periods, and there is no further change in the DC component of current in the transformer.

It can be appreciated from this that the DC component of the current in the transformer is determined by the resistance, referred to here as R5, of the resistor 90, and can be adjusted by changing this resistance. In addition, it will be appreciated that the DC component does not increase core losses in the transformer, because core losses are proportional to AC flux. For high frequencies of the order of 1 to 20 MHz (for example, the bit duration may be 177.2 ns) transformer core losses can be high, so that the transformer 20 is designed with low AC flux change. As a result, even a significant DC component of current will not move the transformer B-H curve into the saturation region, so that the introduction of the DC component of current does not require an increase in the size of the transformer 20.

With equal resistances R for R1 and R2, if the primary side transmits for a long period the steady state DC component Imp is given by the equation Imp=(N.Vp−Vd)/2N.R5, where Vp is the primary supply voltage, Vd is the voltage drop of the diode D4, and N is the transformer turns ratio (secondary/primary turns). For a limited period Tp for which the primary side transmits bits, the DC component Imp(Tp) at the end of this period is given by the equation $Imp(Tp)=(Ims-Io)\ (1-e^{-2TPR/L1})+Io$, where Io is the DC component of current at the start of the period Tp and L1 is the primary magnetizing inductance of the transformer 20.

Thus the resistance R5 of the resistor 90 can be used to control the DC component of the transformer current. In addition, it can be seen from the last equation above that that as the magnetizing inductance L1 decreases, the magnitude of the DC component at the end of the period Tp increases; this is desirable because, to keep the circuit in a predictable state, a bigger DC component is needed when the inductance is smaller.

Figure 12:
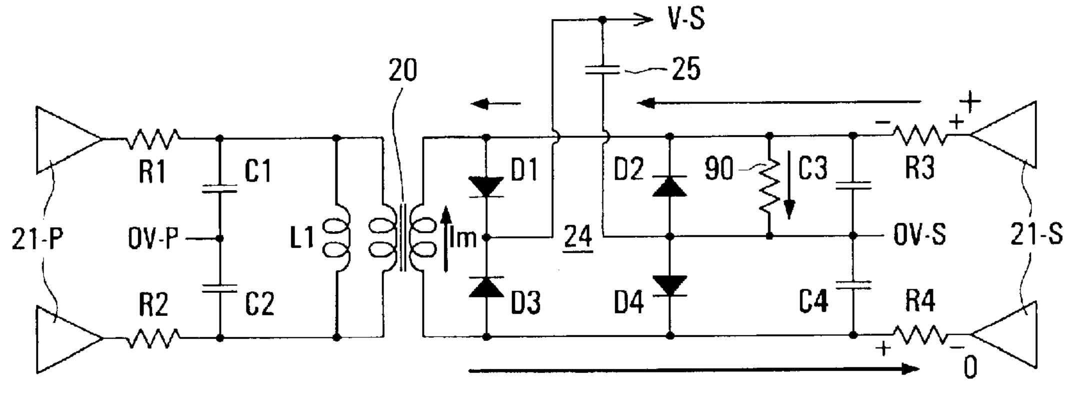
Figure 13:
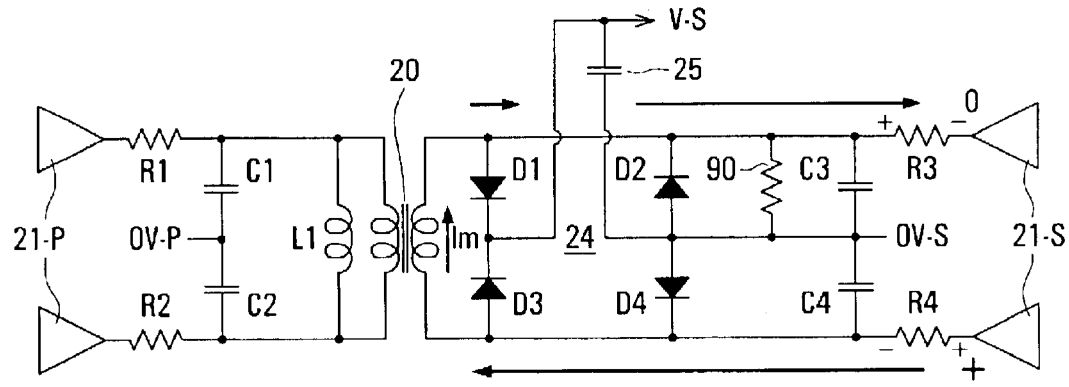

FIGS. 12 and 13 illustrate a similar process which occurs for the opposite direction of signal coupling. In one half-bit period, as shown in FIG. 12, the polarity of the drivers 21-S is such that an additional current flows through the asymmetrical load resistor 90, producing a voltage drop across the resistors R3 and R4 which reduces the voltage applied from the drivers 21-S to the secondary winding of the transformer 20. In the other half-bit period, as shown in FIG. 13, the polarities of the drivers 21-S are reversed and no additional current flows through the resistor 90 to produce such a voltage drop.

The different voltages consequently applied to the transformer in the respective half-bit periods again produce a DC component of current in the transformer, with a polarity which is opposite to that from the drivers for the current flow through the resistor 90. This DC component will increase until a balance is achieved, i.e. until a voltage drop across the resistors R3 and R4 (with the polarities shown in FIG. 13) caused by the DC component is equal to the voltage drop across these resistors (with the polarities shown in FIG. 12) due to the current flow through the resistor 90. Thus again in this balanced state equal voltages are dropped by the resistors R3 and R4 in the two half-bit periods, voltages of equal amplitude are applied to the transformer in the two half-bit periods, and there is no further change in the DC component of current in the transformer.

Again the resistance R5 of the resistor 90 determines and can be changed to adjust the DC component of the transformer current. With equal resistances R3 for the resistors R3 and R4, if the secondary side transmits for a long period the steady state DC component Ims=Vs/4(R5+R3) where Vs is the secondary supply voltage. For a limited period Ts for which the secondary side transmits bits, the DC component Ims(Ts) at the end of this period is given by the equation $Ims(Ts)=(Ims-Io)(1-e^{-2TsR3/(L1.N.N)})+Io$ where Io is the DC component of current at the start of the period Ts and L1 is the primary magnetizing inductance of the transformer 20.

Figure 14:
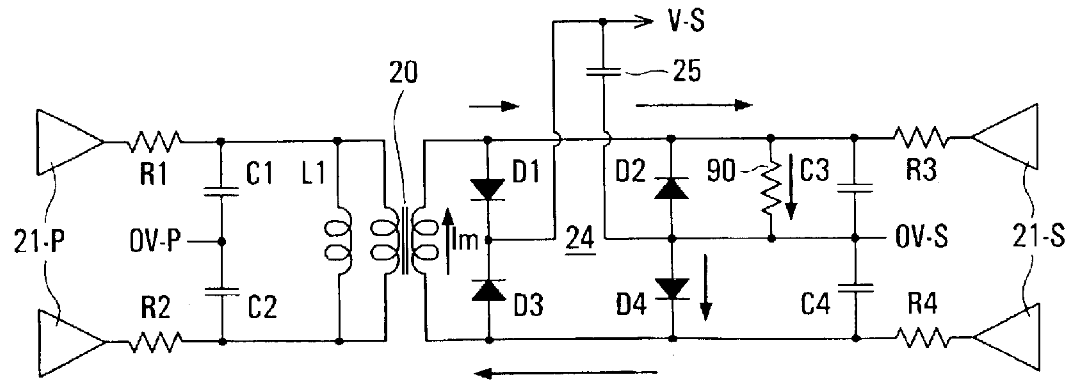

During each guard time or pause in coupling signal bits via the transformer 20, the drivers 21-P and 21-S have high impedance outputs, and there is a DC component of transformer current established which will rapidly charge or discharge the parasitic capacitances C1 to C4, depending upon their states at the end of the signal coupling. As shown in FIG. 14, this produces a current flow via the resistor 90 and the diode D4. If the DC component established in the transformer 20 as described above is sufficient, then this current flow is maintained throughout the duration of the guard time or pause period. The receivers 22-P and 22-S coupled to the transformer windings are supplied with the voltage drop across the resistor 90 and the diode D4, which decays in a predetermined manner to reach a predictable state, and does not resonate, during the guard time or pause period, so that the receivers do not incorrectly detect any signal.

Consequently, the provision of the asymmetrical load, constituted by the resistor 90, to produce a DC component of magnetizing current in the transformer 20 facilitates elimination of oscillations during pauses in the signal coupling via the transformer, and reduces or eliminates the possibility of signal errors due to such oscillations.

Although the resistor 90 results in additional power losses during normal signal coupling via the transformer, current via this resistor flows only during half of each bit period, so that these additional power losses are lower than (e.g. about half of) the additional power losses which would occur using a damping resistor connected in parallel with a winding of the transformer as described above.

Figure 15:
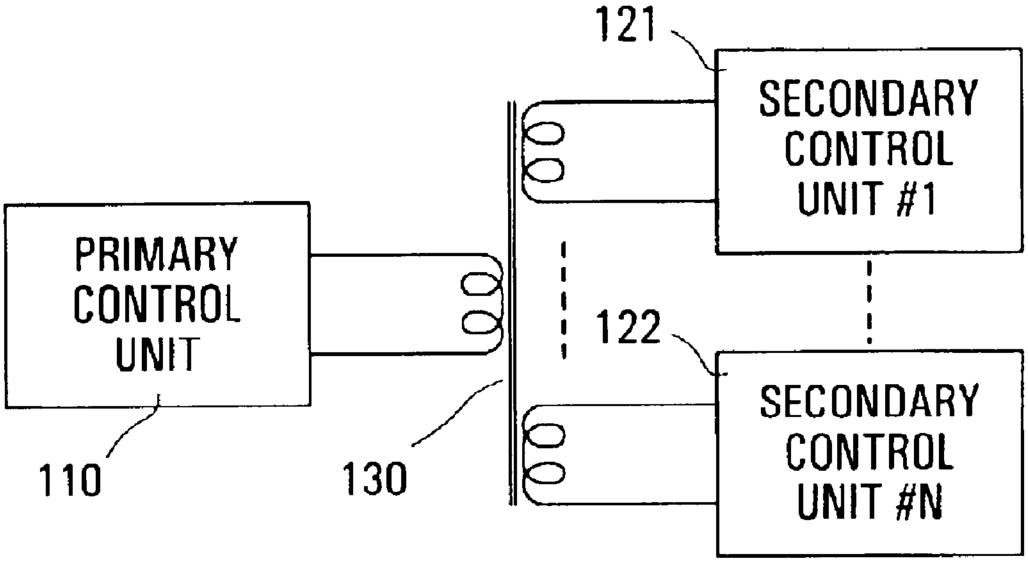
FIG. 15 illustrates a coupling arrangement in accordance with another embodiment of the invention.

FIG. 15 illustrates a coupling arrangement in accordance with another embodiment of the invention. As shown in FIG. 15, a primary unit 110 is coupled to an isolating signal and power coupler constituted by a transformer 130, similarly to the arrangement of the control unit 11 and coupler 13 in FIG. 1. However, in the arrangement of FIG. 15 the transformer 130 has a plurality of secondary windings each of which is connected to a respective one of a plurality of secondary units, two of which are shown in FIG. 15 and referenced 121 and 122 respectively. More generally, as represented by dashed lines and numbers #1 and #N for the units 121, 122 in FIG. 15, there may be an arbitrary number N of secondary units each connected to a respective secondary winding of the transformer 130.

The transformer 130 in the arrangement of FIG. 15 serves to couple signals and power between the units 110, 121, and 122 in any desired manner and in any desired combination of signals and/or power. The primary unit 110 serves to determine timing for the coupling in a similar manner to that described above, but otherwise the primary and secondary units can be similar to one another. Power can be supplied to the primary unit 110 from which it can be transferred to each of the secondary units 121, 122 in a similar manner to that described above. The arrangement preferably operates synchronously as described above, so that power can also be transferred from any of the secondary units 121, 122 to the primary unit 110, and more generally from any of the units 110, 121, and 122 to any of the other units 110, 121, and 122 as may be desired at any particular time. To this end each of the units 110, 121, and 122 can include a buffer and rectifier arrangement coupled to the respective winding of the transformer 130 in a similar manner to that described above.

Because of the relatively arbitrary coupling of power among the units 110, 121, and 122, in FIG. 15 power supplies for these units are not shown. Other circuits such as an NVRAM as described above can be associated with any one or more of the units 110, 121, and 122 and can be powered in a similar manner to the units with which they are associated, as described above.

Signal coupling among the units 110, 121, and 122 can also be in any direction at any time as may be desired. For example, the primary unit 110 may provide a signal timing in which it supplies signals to and receives signals from each of the secondary units 121, 122 in sequence. This signal timing can also include time periods in which signals can be coupled directly between different ones of the secondary units 121 and 122. Furthermore, the signals coupled among the units may themselves be used to communicate desired signalling time periods, or other signalling parameters, for the continuing signal communications among the units 110, 121, and 122. As described above, with synchronous operation the signalling and power coupling among the units can be substantially independent of one another, so that each of these processes can be provided in any desired manner and combination of signal and/or power coupling among the units.

Alternatively, it can be appreciated that one or more of the secondary units 121, 122 may only be required to receive signals and power from other units, in which case each of these one or more of the secondary units need not include any transmit buffers, but may have only a signal receiver for receiving signals coupled via the transformer 130, and a rectifier arrangement for deriving power from these coupled signals.

Although the above description of embodiments of the invention refers to specific parameters and to Manchester coding of signal bits, it should be understood that these are given only by way of example and that instead any or all of the parameters may be changed and/or other coding schemes may be used. For example, each signal bit and its complement could be coupled to provide for error checking.

Although as described above and as shown in the drawings differential signals are coupled via the transformer 20, the signal receivers 21 have differential inputs, the transmit buffers 22 have differential outputs, the potential dividers 23 are similarly balanced, and the rectifier arrangement is constituted by the diode bridge 24, this need not be the case and other arrangements can be provided. For example, either or both of the control units 11 and 12 can instead use an unbalanced arrangement in which one end of the respective transformer winding is connected to the respective ground or 0 V connection, and the other end is coupled to a transmit buffer output and a receiver input which can be positive or negative with respect to 0 V. In this case, each control unit may comprise only a single transmit buffer. In addition, it can be appreciated that the diode bridge 24 can be replaced by another form of rectifier arrangement, such as a full-wave, half-wave, or voltage multiplying rectifier arrangement.

Although embodiments of the invention are described above in the context of coupling signals and power between first and second control units of a power supply controller, the invention is not limited to this application but can also be applied to the coupling of signals and power between arbitrary types of first and second units.

Thus although particular embodiments of the invention and examples have been described above in detail, it can be appreciated that numerous modifications, variations, and adaptations may be made without departing from the scope of the invention as defined in the claims.

What is claimed is:

1. A transformer coupling arrangement comprising:

a transformer having first and second windings;

at least one transmit buffer in a first unit, the buffer having an output coupled to the first winding of the transformer, and at least one signal receiver in a second unit, the receiver having an input coupled to the second winding of the transformer, for coupling a signal via the transformer in a first direction from the first unit to the second unit;

at least one transmit buffer in the second unit, the buffer having an output coupled to the second winding of the transformer, and at least one signal receiver in the first unit, the receiver having an input coupled to the first winding of the transformer, for coupling a signal via the transformer in a second direction from the second unit to the first unit; and a rectifier arrangement coupled to the second winding of the transformer for producing a supply voltage for the second unit from signals coupled in the first direction;

wherein, in each of the first and second units, the at least one transmit buffer comprises at least two transmit buffers having outputs coupled to the respective winding of the transformer for supplying a differential signal thereto.

2. A transformer coupling arrangement as claimed in claim 1 wherein, in each of the first and second units, the at least one signal receiver comprises a differential signal receiver.

3. A transformer coupling arrangement as claimed in claim 2 wherein the rectifier arrangement comprises a diode bridge having an ac input coupled to the second winding of the transformer and a dc output for producing said supply voltage for the second unit, and a capacitor coupled to the dc output for filtering said supply voltage.

4. A transformer coupling arrangement as claimed in claim 3 and including a voltage regulator coupled to the dc output of the diode bridge for regulating said supply voltage.

5. A transformer coupling arrangement as claimed in claim 4 wherein the transformer provides a voltage step-up from the first winding to the second winding.

6. A transformer coupling arrangement as claimed in claim 1 wherein the at least one signal receiver in the second unit is coupled to the second winding of the transformer via a potential divider.

7. A transformer coupling arrangement as claimed in claim 1 wherein the at least one transmit buffer in the first unit comprises at least one plurality of transmit buffers coupled in parallel with one another.

8. A transformer coupling arrangement as claimed in claim 1 wherein the rectifier arrangement comprises a diode bridge having an input coupled to the second winding of the transformer and an output for producing said supply voltage for the second unit, and a capacitor coupled to the output of the diode bridge for filtering said supply voltage.

9. A transformer coupling arrangement as claimed in claim 8 wherein the transmit buffers of the second unit comprise CMOS output circuits having intrinsic diodes which constitute the diode bridge of the rectifier arrangement.

10. A transformer coupling arrangement as claimed in claim 8 wherein the transmit buffers of each of the first and second units comprise complementary switched output circuits, and wherein the complementary switched output circuits of the transmit buffers of the first and second units are arranged for operation synchronously with one another.

11. A transformer coupling arrangement as claimed in claim 10 wherein the complementary switched output circuits of the transmit buffers of the second unit comprise intrinsic diodes which constitute the diode bridge of the rectifier arrangement.

12. A transformer coupling arrangement as claimed in claim 10 wherein the second unit comprises a phase locked loop responsive to signals coupled from the first unit via the transformer for controlling the complementary switched output circuits of the transmit buffers of the second unit synchronously with the complementary switched output circuits of the transmit buffers of the first unit.

13. A transformer coupling arrangement as claimed in claim 12 and including a control arrangement for increasing a supply voltage for the transmit buffers of the first unit prior to synchronous operation of the complementary switched output circuits of the transmit buffers of the second unit.

14. A transformer coupling arrangement as claimed in claim 13 wherein the first and second windings of the transformer have a turns ratio of 1:1.

15. A transformer coupling arrangement as claimed in claim 10 wherein in each of the first and second units each of the at least two transmit buffers, having outputs coupled to the respective winding of the transformer for supplying a differential signal thereto, comprises a plurality of transmit buffers coupled in parallel with one another.

16. A transformer coupling arrangement as claimed in claim 1 and including an asymmetrical load coupled to the rectifier arrangement for providing a DC component of current in the transformer.

17. A transformer coupling arrangement as claimed in claim 3 and including a resistor coupled in parallel with a diode of the diode bridge.

18. A transformer coupling arrangement as claimed in claim 8 and including a resistor coupled in parallel with a diode of the diode bridge.

19. A transformer coupling arrangement as claimed in claim 1 wherein the transformer includes a third winding, the arrangement including a third unit comprising a signal receiver having an input coupled to the third winding of the transformer and a rectifier arrangement coupled to the third winding of the transformer for producing a supply voltage for the third unit from signals coupled via the transformer.

20. A transformer coupling arrangement as claimed in claim 19 wherein the third unit further comprises at least one transmit buffer coupled to the third winding of the transformer for coupling a signal from the third unit via the transformer.

21. A transformer coupling arrangement comprising:

a transformer having first and second windings;

a first unit comprising two transmit buffers having outputs coupled to the first winding of the transformer for supplying a signal differentially thereto, and a receiver having an input coupled to the first winding of the transformer for receiving a signal therefrom;

a second unit comprising two transmit buffers having outputs coupled to the second winding of the transformer for supplying a signal differentially thereto, and a receiver having an input coupled to the second winding of the transformer for receiving a signal therefrom; and a rectifier arrangement comprising a diode bridge having an ac input coupled to the second winding of the transformer and a dc output for producing a supply voltage for the second unit, and a capacitor coupled to the dc output of the diode bridge for filtering the supply voltage.

22. A transformer coupling arrangement as claimed in claim 21 and including a voltage regulator coupled to the dc output of the diode bridge for regulating said supply voltage, wherein the transformer provides a voltage step-up from the first winding to the second winding.

23. A transformer coupling arrangement as claimed in claim 21 wherein the transmit buffers of the second unit comprise CMOS output circuits having intrinsic diodes which constitute the diode bridge of the rectifier arrangement.

24. A transformer coupling arrangement as claimed in claim 20 wherein the transmit buffers of each of the first and second units comprise complementary switched output circuits, and wherein the complementary switched output circuits of the transmit buffers of the first and second units are arranged for operation synchronously with one another.

25. A transformer coupling arrangement as claimed in claim 24 wherein the complementary switched output circuits of the transmit buffers of the second unit comprise intrinsic diodes which constitute the diode bridge of the rectifier arrangement.

26. A transformer coupling arrangement as claimed in claim 25 wherein the second unit comprises a phase locked loop responsive to signals coupled from the first unit via the transformer for controlling the complementary switched output circuits of the transmit buffers of the second unit synchronously with the complementary switched output circuits of the transmit buffers of the first unit.

27. A transformer coupling arrangement as claimed in claim 26 and including a control arrangement for increasing a supply voltage for the transmit buffers of the first unit prior to synchronous operation of the complementary switched output circuits of the transmit buffers of the second unit.

28. A transformer coupling arrangement as claimed in claim 21 wherein the first and second windings of the transformer have a turns ratio of 1:1.

29. A transformer coupling arrangement as claimed in claim 21 and including a resistor coupled in parallel with a diode of the diode bridge.

30. A transformer coupling arrangement as claimed in claim 21 wherein the transformer includes a third winding, the arrangement including a third unit comprising a receiver having an input coupled to the third winding of the transformer for receiving a signal therefrom and a rectifier arrangement coupled to the third winding of the transformer for producing a supply voltage for the third unit from signals coupled via the transformer.

31. A transformer coupling arrangement as claimed in claim 30 wherein the third unit further comprises two transmit buffers having outputs coupled to the second winding of the transformer for supplying a signal differentially thereto.

32. A transformer coupling arrangement comprising:

a transformer having first and second windings;

a first unit comprising two transmit buffers having CMOS output circuits coupled to the first winding of the transformer for supplying a signal differentially thereto, and a receiver having an input coupled to the first winding of the transformer for receiving a signal therefrom;

a second unit comprising two transmit buffers having CMOS output circuits coupled to the second winding of the transformer for supplying a signal differentially thereto, and a receiver having an input coupled to the second winding of the transformer for receiving a signal therefrom;

a rectifier arrangement including a diode bridge, comprising intrinsic diodes of the CMOS output circuits of the transmit buffers of the second unit, and a capacitor coupled to a dc output of the diode bridge for producing a supply voltage for the second unit from signals coupled from the first unit via the transformer; and a control arrangement for controlling the CMOS output circuits of the transmit buffers of the second unit synchronously with the CMOS output circuits of the transmit buffers of the first unit.

33. A transformer coupling arrangement as claimed in claim 32 wherein the control arrangement comprises a phase locked loop responsive to signals coupled from the first unit via the transformer.

34. A transformer coupling arrangement as claimed in claim 33 and including a control arrangement for increasing a supply voltage for the transmit buffers of the first unit prior to synchronous operation of the CMOS output circuits of the transmit buffers of the first and second units.

35. A transformer coupling arrangement as claimed in claim 33 wherein the first and second windings of the transformer have a turns ratio of 1:1.

36. A transformer coupling arrangement comprising:

a transformer having at least three windings; and at least three units each having a signal coupling arrangement for coupling signals to and/or from a respective winding of the transformer whereby signals are coupled via the transformer among the units;

wherein at least one of the units comprises a rectifier arrangement coupled to the respective winding of the transformer for producing a supply voltage for the respective unit from signals coupled via the transformer from another of the units.

37. A transformer coupling arrangement as claimed in claim 36 wherein the signal coupling arrangement of each of the units comprises a transmit buffer for coupling signals to the transformer and a signal receiver for receiving a signal coupled via the transformer.

38. A transformer coupling arrangement as claimed in claim 37 wherein each of the units includes a synchronous rectifier arrangement coupled to the respective winding of the transformer.

* * * * *